United States Patent
Huang et al.

(10) Patent No.: US 8,609,545 B2
(45) Date of Patent: Dec. 17, 2013

(54) METHOD TO IMPROVE MASK CRITICAL DIMENSION UNIFORMITY (CDU)

(75) Inventors: I-Hsiung Huang, Hsinchu County (TW); Chi-Lin Lu, Hsinchu (TW); Heng-Jen Lee, Hsinchu County (TW); Sheng-Chi Chin, Jhubei (TW); Yao-Ching Ku, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 927 days.

(21) Appl. No.: 12/031,501

(22) Filed: Feb. 14, 2008

(65) Prior Publication Data

US 2009/0206057 A1 Aug. 20, 2009

(51) Int. Cl.
*H01L 21/302* (2006.01)
*H01L 21/461* (2006.01)

(52) U.S. Cl.
USPC ........... 438/706; 438/707; 438/708; 438/709; 438/710; 438/711; 438/712; 438/713; 438/714

(58) Field of Classification Search
None
See application file for complete search history.

(56) References Cited

U.S. PATENT DOCUMENTS

| | | | |
|---|---|---|---|
| 6,511,575 B1* | 1/2003 | Shindo et al. | 355/30 |
| 6,878,898 B2* | 4/2005 | Hogan et al. | 219/121.43 |
| 7,128,806 B2 | 10/2006 | Nguyen et al. | |
| 2004/0149389 A1 | 8/2004 | Fink | |
| 2005/0042881 A1* | 2/2005 | Nishimoto et al. | 438/710 |
| 2006/0000802 A1* | 1/2006 | Kumar et al. | 216/67 |
| 2008/0100214 A1* | 5/2008 | Chang et al. | 313/570 |

FOREIGN PATENT DOCUMENTS

CN 1762039 4/2006

OTHER PUBLICATIONS

Chinese Patent Office, Office Action dated Nov. 23, 2010, Application No. 200810133212.1, 4 pages.

* cited by examiner

*Primary Examiner* — Duy Deo
(74) *Attorney, Agent, or Firm* — Haynes and Boone, LLP

(57) ABSTRACT

A method and system for fabricating a substrate is disclosed. First, a plurality of process chambers are provided, at least one of the plurality of process chambers adapted to receive at least one plasma filtering plate and at least one of the plurality of process chambers containing a plasma filtering plate library. A plasma filtering plate is selected and removed from the plasma filtering plate library. Then, the plasma filtering plate is inserted into at least one of the plurality of process chambers adapted to receive at least one plasma filtering plate. Subsequently, an etching process is performed in the substrate.

12 Claims, 9 Drawing Sheets

METHOD TO IMPROVE MASK CRITICAL DIMENSION UNIFORMITY (CDU)

BACKGROUND

In semiconductor manufacturing technology, a mask (also referred to as a photomask or reticle) is used by a photolithography system to expose a pattern onto a substrate. The pattern can include many small or tight features, which are defined by the critical dimension ("CD"). CD defines such things as gate width, the minimum width of a line or the minimum space between two lines permitted in the fabrication of a device. As the critical dimensions of a mask or wafer become continually smaller (e.g., from 45 nm to 32 nm), it is important that dimensional and geometrical variations of the pattern features remain small. Such variations of the pattern features result in CD uniformity error ("CDU").

Dimensional and geometrical variations of the pattern features can be introduced during various processes throughout mask fabrication. For example, while forming a pattern in a mask or semiconductor wafer, etching loading effects during an etching process may result in critical dimension variation associated with a global etching pattern density.

One solution that addresses reducing CDU errors introduced during an etching process is disclosed in U.S. Publication No. 2006-0000802 A1, entitled "Method and Apparatus for Photomask Plasma Etching," issued to Kumar et al., which is hereby incorporated by reference. This solution provides a method and apparatus that reduces loading effects introduced in the plasma etching process by providing an ion-radical shield disposed in a process chamber above a substrate by a plurality of support legs. However, this solution presents several disadvantages: (1) the ion-radical shield may not be changed automatically or easily; (2) the support structure (plurality of legs) for the ion-radical shield results in the generation of particles during the etching process, particularly caused by vibrations; and (3) the ion-radical shield fails to remedy all mask critical density uniformity error, specifically global loading effects present from processes other than etching (i.e., baking, developing, and exposing process).

Accordingly, what is needed is a system and method for improving mask critical dimension uniformity.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
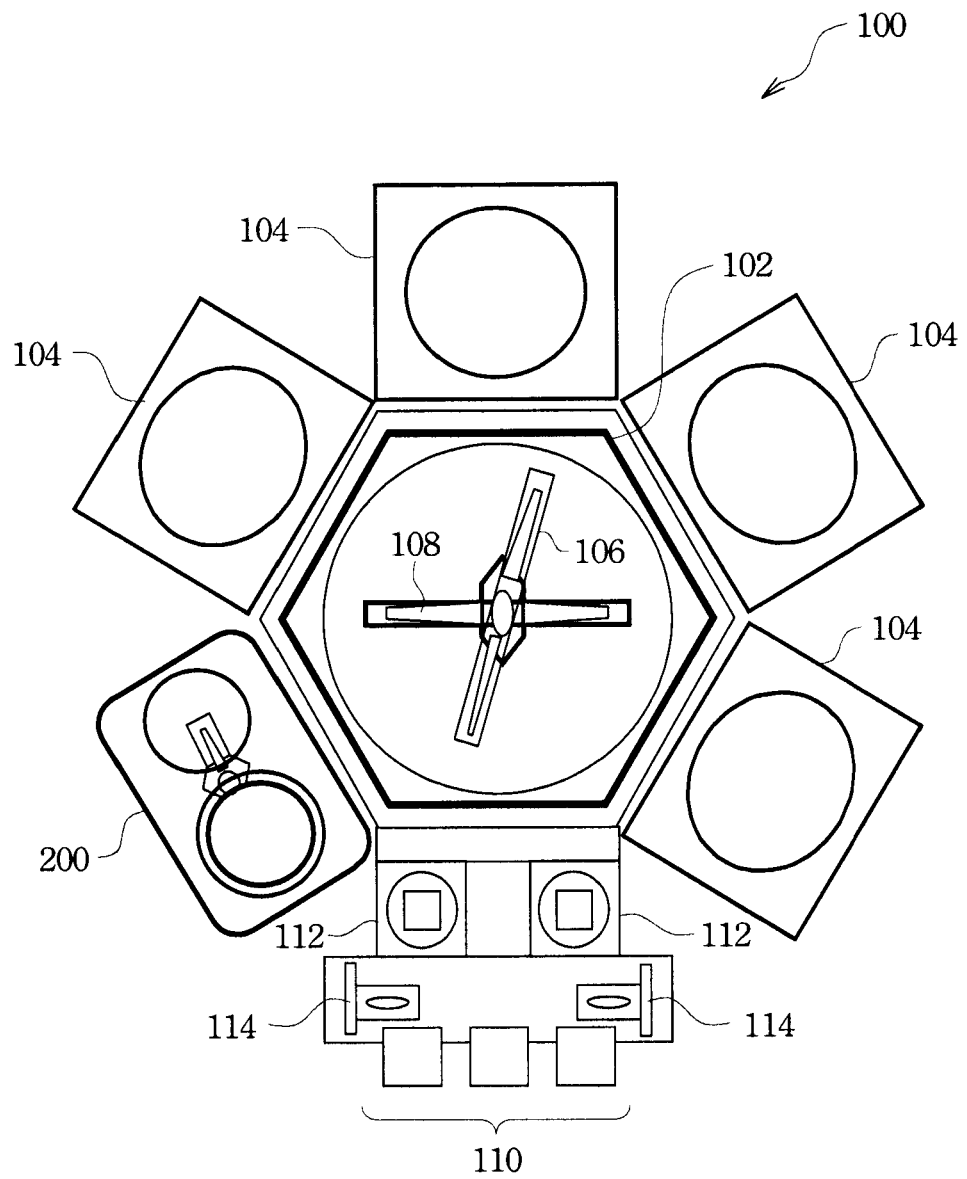
FIG. 1 is a block diagram of a system for etching a substrate according to one embodiment of the present invention.

The present disclosure relates generally to the field of substrate fabrication, and more particularly, to a system and method for etching a substrate that improves critical dimension uniformity.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 through 7, a system 100 and a method 300 for etching a substrate are collectively described below. A substrate may comprise a mask (photomask or reticle, collectively referred to as mask), semiconductor substrate, or any base material on which processing is conducted to produce new film or layers of material. It is understood that additional features can be added in the system 100, and some of the features described below can be replaced or eliminated, for additional embodiments of the system. It is further understood that additional steps can be provided before, during, and after the method 300 described below, and some of the steps described below can be replaced or eliminated, for additional embodiments of the method. The present embodiment of system 100 and method 300 remedies global loading effects present in a substrate that arise during fabrication processes, such as baking, developing, exposure, and etching.

Referring to FIG. 1, the substrate etching system 100 comprises a carrier chamber(s) 102, a process chamber(s) 104, a lower mask transfer arm 106, an upper plasma filtering plate transfer arm 108, a mask standardized mechanical interface (SMIF) POD 110, a mask loadlock(s) 112, a mask SMIF transfer arm(s) 114, and a plasma filtering plate (PFP) library process chamber 200.

In the present embodiment, the system 100 includes at least one hexagonal or otherwise shaped carrier chamber 102, wherein etching items may be transported by one or more robotic arms, such as substrates (e.g., masks) undergoing processing and plasma filtering plates utilized during processing. The system 100 further comprises one or more process chambers 104. An etching process occurs within the one or more process chambers 104. The etching process may use one or more etching steps, and may be dry etching, wet etching, and/or other etching methods. The etching process may be either purely chemical (plasma etching), purely physical (ion milling), or combinations thereof (reactive ion etching). In one embodiment, the process chambers 104 may comprise a MoSi etching process chamber, a Cr etching process chamber, a CrN etching process chamber, a TaN etching process chamber, an oxide etching process chamber, other etching process chambers, and/or combinations thereof.

The system 100 may have multiple robotic arms that transport etching items within carrier chamber 102. The etching items transported may include substrates, masks, plasma filtering plates, wafers, combinations thereof, or any other suitable etching item for the system 100. In the present embodiment, the system 100 comprises two robotic arms within the carrier chamber 102: lower mask transfer arm 106 and upper plasma filtering plate transfer arm 108. The mask transfer arm 106 transfers masks from the mask loadlock 112 and within the carrier chamber 102 to various process chambers 104 for etching. The plasma filtering plate transfer arm 108 transfers plasma filtering plates from the PFP library process chamber 200 and within the carrier chamber 102 to various process chambers 104 that perform plasma etching processes. Alternate embodiments may comprise an upper mask transfer arm and lower plasma filtering plate transfer arm, multiple mask transfer arms, and/or multiple plasma filtering plate transfer arms. Further, the locations where the mask transfer arm 106 and plasma filtering plate transfer arm 108 transport masks and/or plasma filtering plates is not limited by the present embodiment.

The mask SMIF POD 110 and mask loadlock 112 are for loading masks into the carrier chamber 102. The present embodiment includes first and second mask loadlocks 112. The mask loadlock 112 may also serve as holding chambers between processes performed in other chambers, such as when a process chamber is undergoing purging, preheating, etc. Robotic arms, mask SMIF transfer arms 114, transfer mask substrates from the mask SMIF POD 110 to the mask loadlock 112. Alternate embodiments may include one or more mask SMIF transfer arms. In other embodiments, the mask SMIF POD and mask loadlock may load substrates, or any other suitable item, into the carrier chamber.

Figure 2:
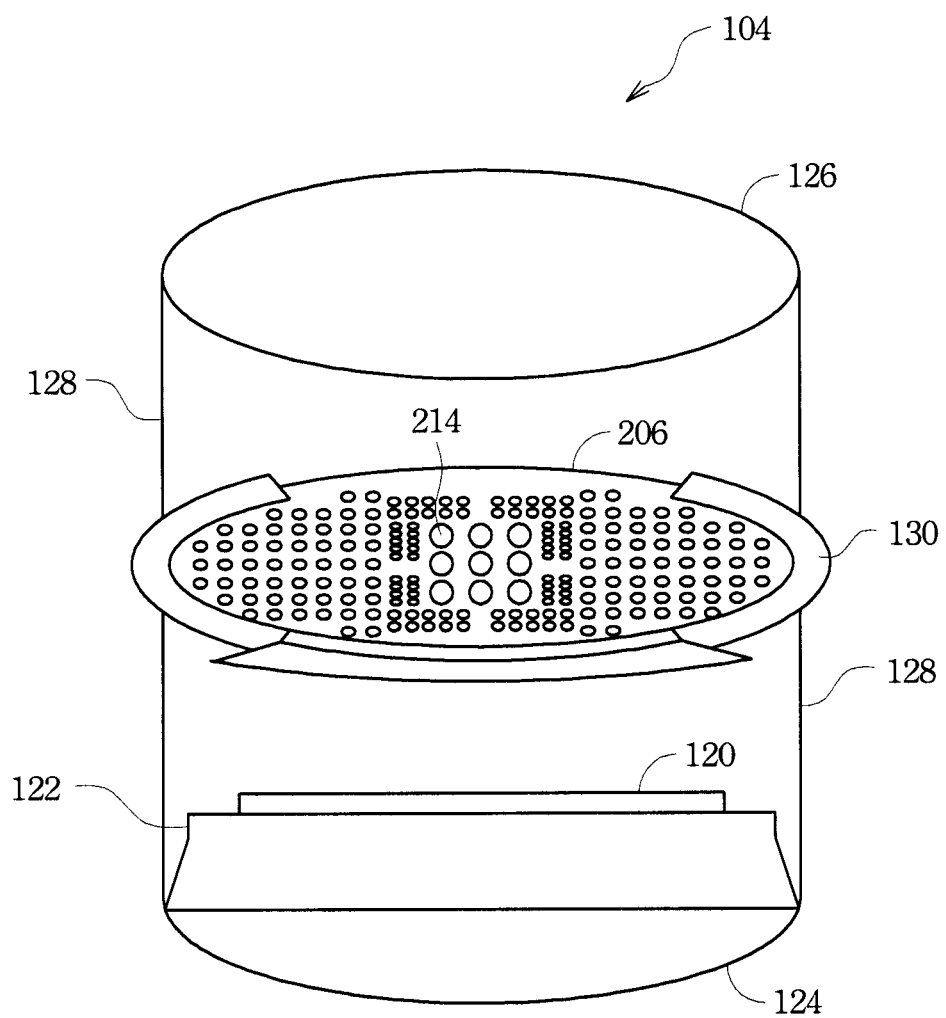
FIG. 2 is a side view according to one embodiment of a process chamber adapted to receive a plasma filtering plate within the system of FIG. 1.

FIG. 2 provides a side view according to one embodiment of a process chamber 104 within system 100 that is adapted to receive a plasma filtering plate(s) 206. In alternate embodiments, the process chamber 104 may be adapted to receive multiple plasma filtering plates 206. The process chamber 104 comprises a mask substrate 120, a mask substrate pedestal 122, a lower surface 124, an upper surface 126, a sidewall 128, an indentation(s) 130, and a plasma filtering plate 206 with a plurality of apertures 214.

It is understood that, in system 100, at least one process chamber 104 is adapted to receive a plasma filtering plate 206 and that multiple process chambers 104 may be adapted to receive a plasma filtering plate 206. It is further understood that the process chamber 104 and plasma filtering plate 206 are not limited to a circular/spherical shape as shown in FIG. 2, and the sizes, shapes, and dimensions of each may vary according to alternate embodiments. Further, process chamber 104 may include a means for precisely positioning and aligning the mask substrate 120 within the process chamber 104 and/or with the plasma filtering plate 206.

The mask substrate 120 may comprise a transparent material, such as fused quartz ($SiO_2$), calcium fluoride ($CaF_2$), or other suitable material. The mask substrate 120 may further comprise an absorption layer formed using a plurality of processes and materials, such as depositing a metal film made with chromium (Cr) and iron oxide, or an inorganic film made with MoSi, ZrSiO, SiN, TaN, CrN, TaBN, LR—TaBN, and/or TiN. The absorption layer may have a multilayer structure. For example, the mask substrate 120 may include a molybdenum silicide (MoSi) layer having partial light absorption and/or a chromium (Cr) layer having complete absorption. The mask substrate 120 may further comprise one or more anti-reflective coating (ARC) layers disposed between various interfaces. The mask substrate 120 may further comprise a photoresist (resist or PR) layer overlying the absorption layers, coated by a method such as spin-on coating. In alternate embodiments, the mask substrate may be a semiconductor substrate or wafer, or any base material on which processing is conducted to produce new film or layers of material.

Figure 3A:
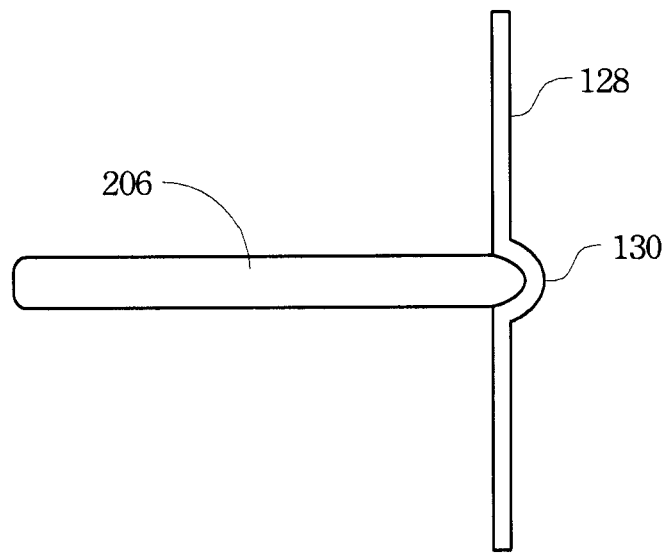
FIGS. 3A-3E are cross-sectional views of the sidewall of a process chamber according to various embodiments.

In process chamber 104, the indentation 130 in the sidewall 128 receives and supports plasma filtering plate 206. In the present embodiment, the plasma filtering plate 206 is disposed between the lower surface 124 and upper surface 126 above the mask substrate 120 and mask pedestal 122. With reference to FIGS. 2 and 3A, the indentation 130 forms an arc as it extends from the sidewall 128 out of the process chamber 104. The arc-shaped indentation 130 extends along two portions of the process chamber's perimeter and receives the plasma filtering plate 206.

It is understood that indentation 130 may extend from the sidewall 128 into or out of the process chamber 104. Further, the indentation 130 comprises any structure that receives and supports the plasma filtering plate 206 above the mask substrate 120 without using legs as a support structure. Utilizing legs as support structures for the plasma filtering plate 206 introduces particles into the process chamber through continuous use and vibration. The present embodiment utilizes the process chamber 104 itself to secure the plasma filtering plate 206 within the process chamber 104.

Figure 3B:
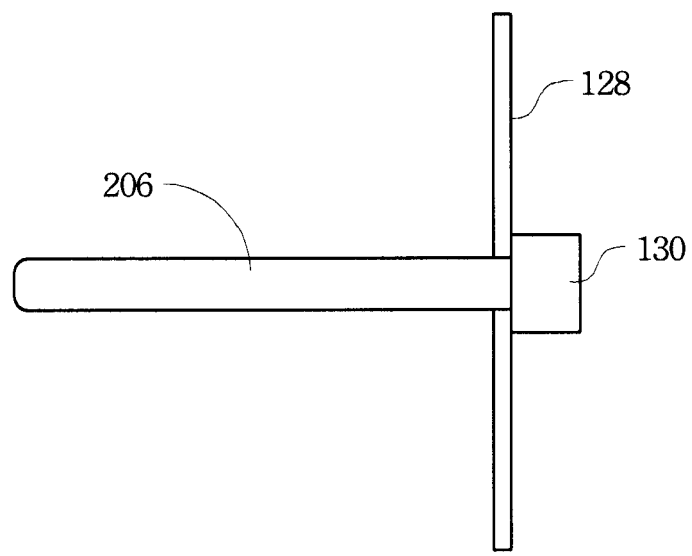
Figure 3C:
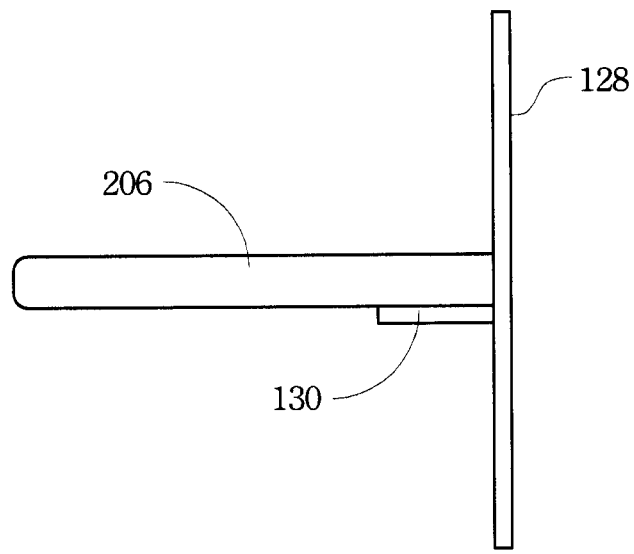
Figure 3D:
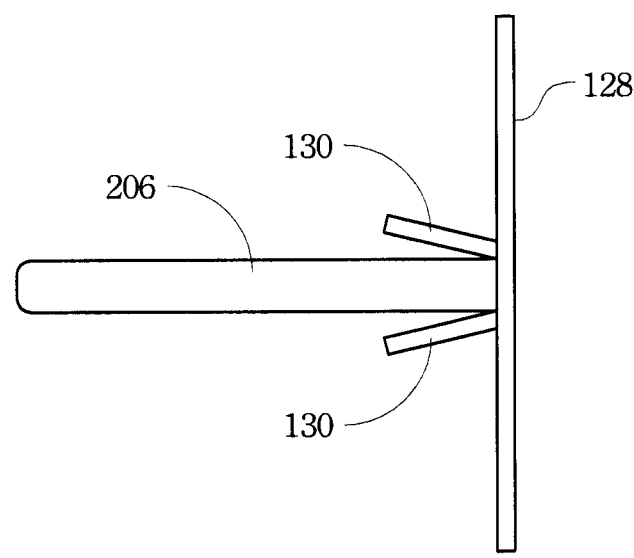
Figure 3E:
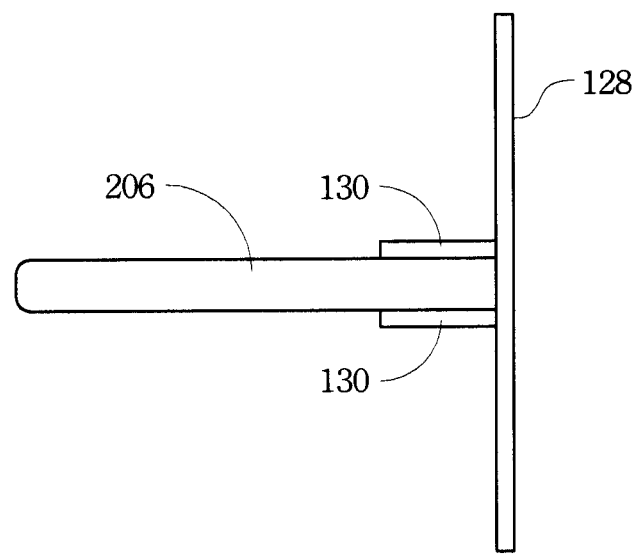
Figure 4A:
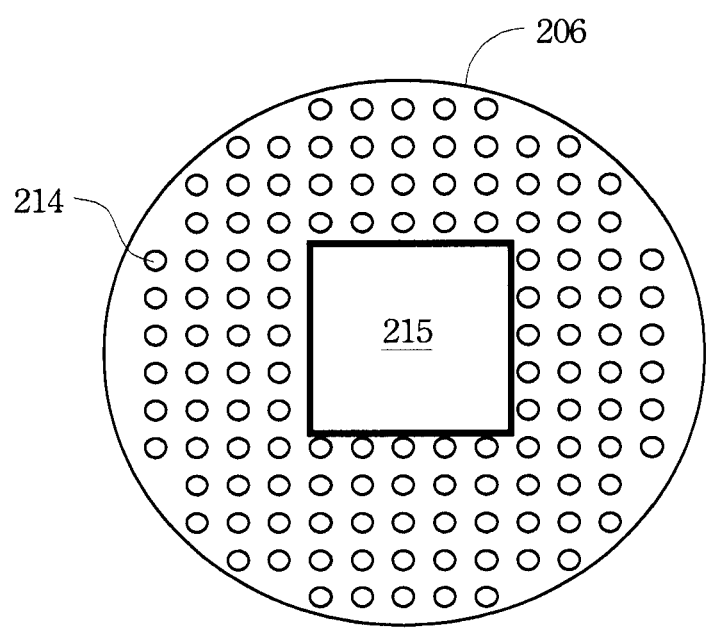
FIGS. 4A-4D are cross-sectional views of several embodiments of a plasma filtering plate.
Figure 4B:
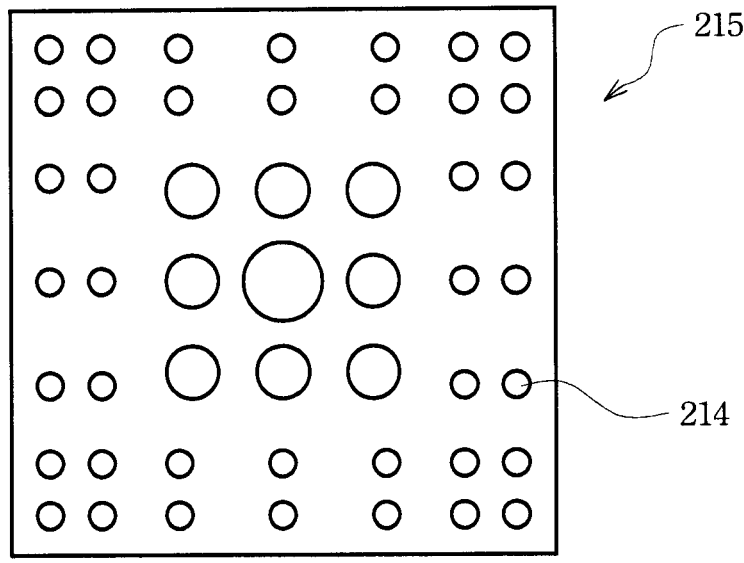
Figure 4C:
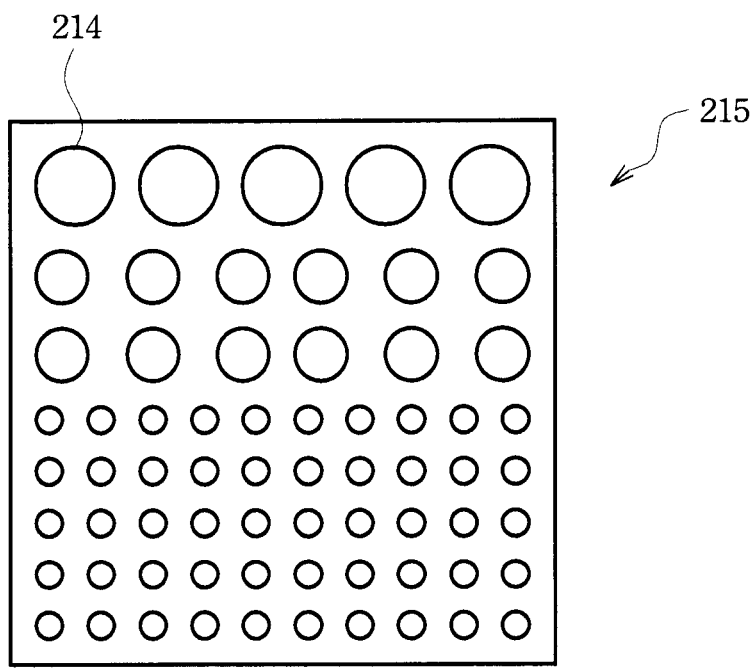
Figure 4D:
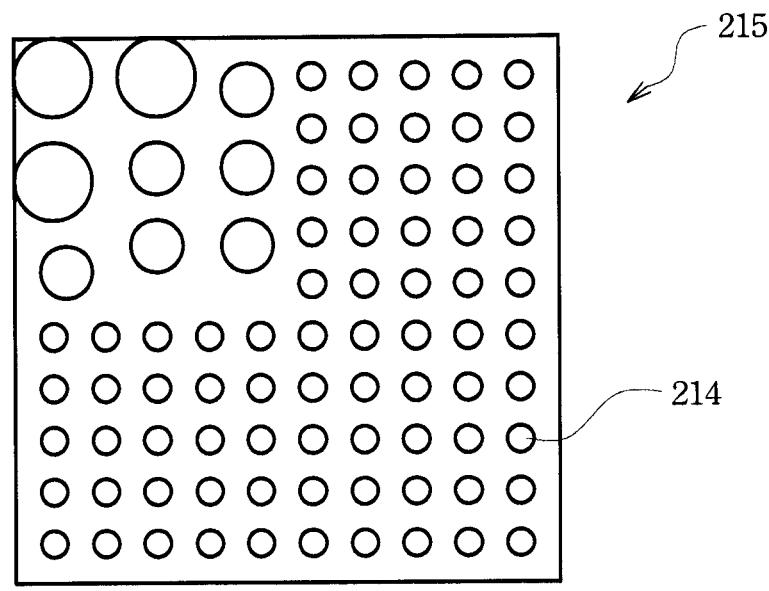

FIGS. 3B-3E illustrate additional examples of indentation 130 that may extend from the sidewall 128 of process chamber 104. FIG. 3B illustrates an indentation 130 that forms a rectangular-shaped area as it extends from the sidewall 128 out of the process chamber 104. The rectangular-shaped area indentation receives a plasma filtering plate 206. Referring to FIG. 3C, in one embodiment, an indentation 130 extends into the process chamber 104, acting as a ledge that plasma filtering plate 206 may be placed on. In another embodiment, FIG. 3D, indentation 130 comprises a lower and upper portion extending from the sidewall 128 into the process chamber. The upper and lower portion extend into the process chamber, angled in opposite directions from one another (i.e., the upper portion extends angled away from the lower portion and vice versa). In an alternate embodiment, the upper and lower portion may extend into the process chamber, angled towards one another (i.e., the upper portion extends angled towards the lower portion and vice versa) or angled in the same direction (e.g., upper and lower portion are both angled upward). The upper and lower portion are capable of receiving a plasma filtering plate 206. In yet another embodiment, FIG. 3E depicts indentation 130 comprising a lower and upper portion extending at a 90 degree angle from the sidewall 128 into the process chamber for receiving plasma filtering plate 206.

In alternate embodiments, the indentation 130 may include any structure that receives and supports the plasma filtering plate. The size and shape of the indentation 130 may very depending on the size, shape, dimension, and/or number of plasma filtering plates; the size, shape, and dimension of the process chamber; the amount of support required; the distance between the plasma filtering plate and mask substrate; the distance between plasma filtering plates; the type of plasma etching process; etc. The indentation may comprise an upper and/or lower portion, extend along the entire perimeter of the process chamber, and/or extend along only portions of the process chamber. Further, the indentation may comprise only one size and shape or multiple sizes and shapes in combination to form the appropriate support structure for the plasma filtering plate. In yet other embodiments, the indentation may extend from the sidewall at any angle.

In one embodiment, the process chamber 104 may have the indentation 130 in the sidewall 128 such that it slidably receives and supports the plasma filtering plate 206. In alternate embodiments, the indentation may be a ledge that the plasma filtering plate may be placed on. In yet another embodiment, the process chamber 104 may have the indentation 130 run around the perimeter of the process chamber 104, further including a means (e.g., a hinged door) allowing access for inserting and removing the plasma filtering plate.

Also, it is understood that the process chamber 104 may have multiple sidewalls 128.

During the substrate (e.g., mask) fabrication process, a plurality of pattern features are formed in the substrate. The plurality of pattern features include many small or tight features, which are defined by the critical dimension (e.g., gate width, the minimum width of a line or the minimum space between two lines permitted in the fabrication of the substrate). Dimensional and geometrical variations of the pattern features may result during the mask fabrication process. These variations produce errors in the critical dimension uniformity ("CDU") profile of the mask. Such variations result from global loading effects.

In the present embodiment, the plasma filtering plate 206 contains multiple apertures 214. However, it is understood that the plasma filtering plate 206 may have only one aperture 214 or no aperture. The apertures 214 are designed and patterned to remedy global loading effects present in the mask, ultimately improving the CDU profile of the mask. The global loading effects may arise from any process during mask fabrication, such as baking, exposing, developing, and etching. By remedying the global loading effects, the mask CDU is improved.

The patterns formed by the apertures 214 in the plasma filtering plate 206 may comprise any pattern that will improve the CDU profile of a mask and/or remedy global loading effects. For example, referring to FIGS. 4A-4D, alternate embodiments of a plasma filtering plate 206 with center 215 (FIG. 4A) are provided, wherein the apertures 214 within center 215 of the plasma filtering plate may be patterned to improve radial CDU (FIG. 4B), side to side CDU (FIG. 4C), one side CDU (FIG. 4D), and/or other forms and combinations of CDU. It is understood that the apertures 214 may be any shape, size, or dimension. Further, the plasma filtering plate 206 may include apertures 214 of only one shape and size or a combination of various shapes and sizes. It is understood that the aperture patterns depicted in FIGS. 4A-4D in no way limit the possible aperture patterns that may be in plasma filtering plate 206. In alternate embodiments, the apertures 214 may be patterned to remedy global loading effects and improve the CDU of any substrate (e.g., semiconductor substrates or wafers, not solely masks).

Figure 5:
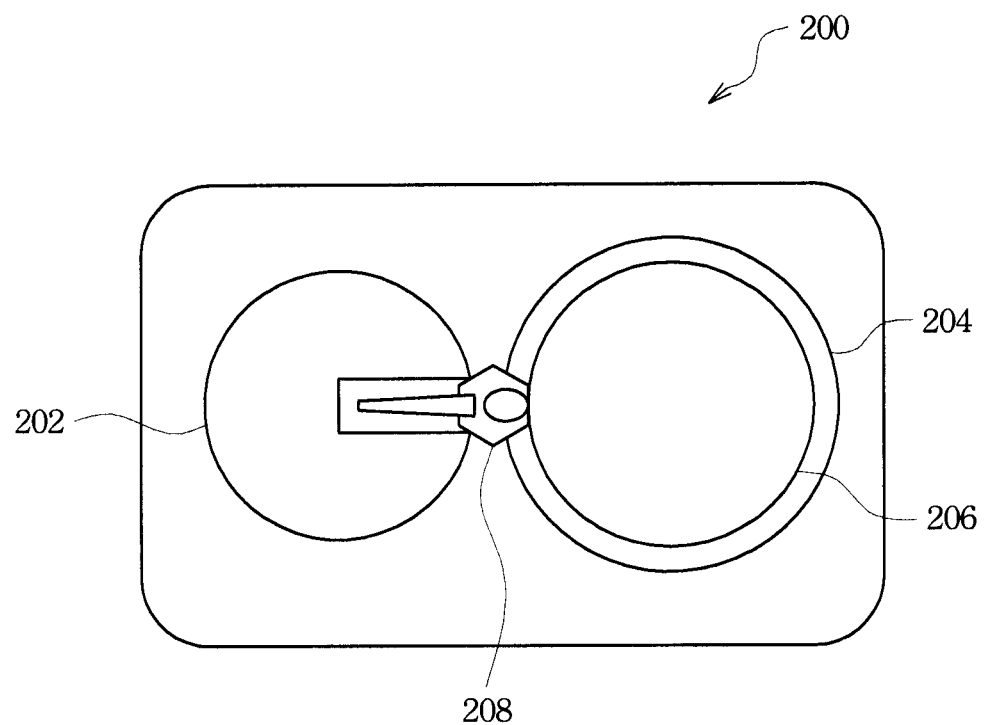
FIGS. 5 and 6 are a top and side view of one embodiment of a plasma filtering plate process chamber within the system of FIG. 1.
Figure 6:
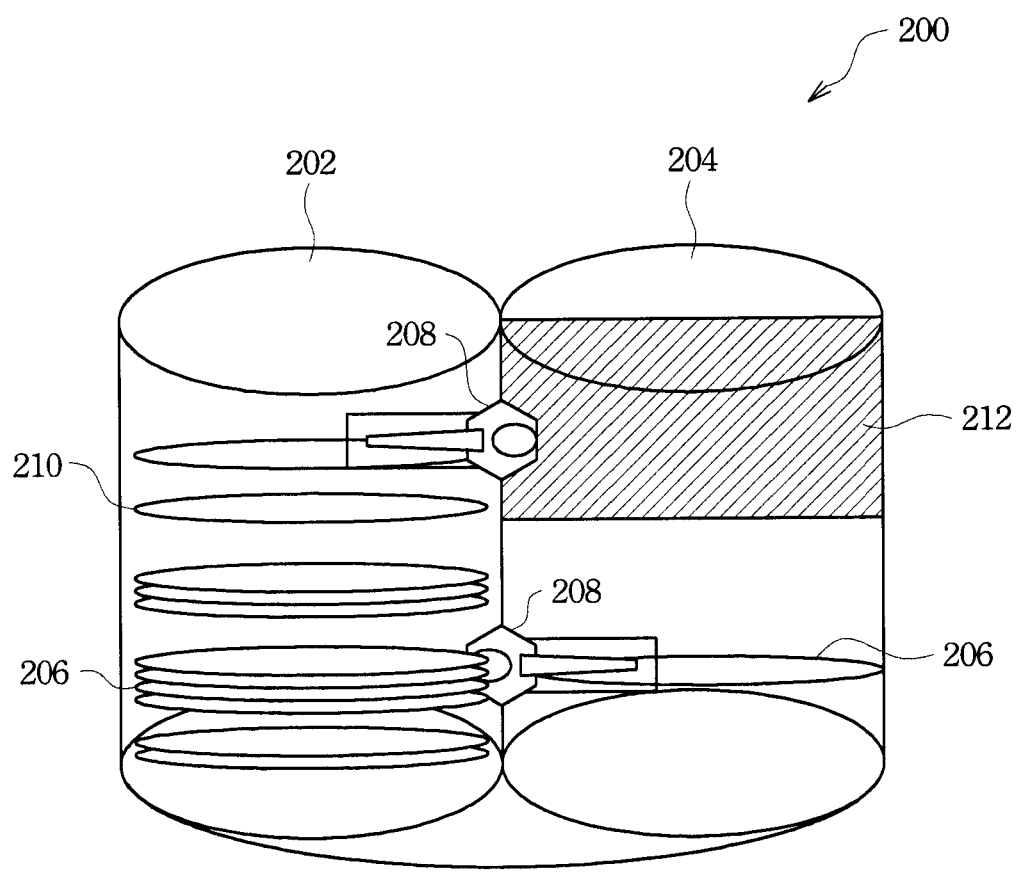

FIGS. 5 and 6 provide a top view and side view according to one embodiment of the plasma filtering plate library process chamber 200 within the substrate etching system 100. The PFP library process chamber 200 includes a plasma filtering plate library 202, a plasma filtering plate loadlock 204, a plasma filtering plate 206, a plate transfer arm 208, a loadlock ring 210, and a PFP loadlock chamber 212. It is understood that the PFP library process chamber 200 may include multiple plasma filtering plate loadlocks, plasma filtering plates, plate transfer arms, loadlock rings, and/or loadlock chambers.

Plasma filtering plate library 202 holds one or more plasma filtering plates 206. The one or more plasma filtering plates 206 held within the plasma filtering plate library 202 are patterned with a plurality of apertures 214 as discussed above. Each plasma filtering plate 206 contains apertures 214 designed to improve a particular CDU error. For example, referring again to FIGS. 4B-4D, plasma filtering plate library 202 may hold a plasma filtering plate patterned to remedy only radial CDU error (FIG. 4B), another to remedy only side to side CDU (FIG. 4C), another to remedy one side CDU (FIG. 4D), and another to remedy all the previously mentioned CDU errors simultaneously. In addition, a plasma filtering plate may remedy global loading effects present from either the baking, developing, exposing, or etching process individually, or combinations thereof.

In the preferred embodiment, the plasma filtering plate library 202 holds the plasma filtering plate 206 for remedying every type of CDU error and/or global loading effects present in the substrate. Integrating a plasma filtering plate library 202 into the system 100 allows for automatic and easy changing of the plasma filtering plate 206 within various process chambers 104. Further, with the integrated plasma filtering plate library, the system 100 has access to a multitude of plasma filtering plates 206 to quickly and automatically remedy various critical dimension uniformity errors present in substrates (e.g., masks).

In one embodiment, the plasma filtering plate 206 may comprise one or more subset of plates, each designed to remedy a particular loading effect or defect within the mask substrate. In alternate embodiments, multiple plasma filtering plates 206 may be combined within a single process chamber 104 as disclosed in U.S. application Ser. No. 11/553,590 (Attorney Docket No. 2006-0087/24061.760), entitled "Apparatus and Method for Regional Plasma Control," which is hereby incorporated by reference.

In another embodiment, at least one plasma filtering plate 206 may comprise a transparent material such as quartz, glass, combinations thereof, or any other suitable material. During the etching process, using plasma filtering plates comprising a transparent material reduces the negative impact caused by the glow discharge on the photoresist layer in the mask substrate 120, which allows mask fabrication processes to use thinner layers of photoresist.

In the present embodiment, a robotic arm, plate transfer arm 208, transfers plasma filtering plate 206 from the lift ring 210 in PFP library 202 to the PFP loadlock chamber 212 in the PFP loadlock 204 and vice versa. Referring again to FIG. 1, the plasma filtering plate transfer arm 108 removes plasma filtering plate 206 from the PFP loadlock chamber 212 and transports the plasma filtering plate 206 within the carrier chamber 102 to the appropriate process chambers 104.

Figure 7:
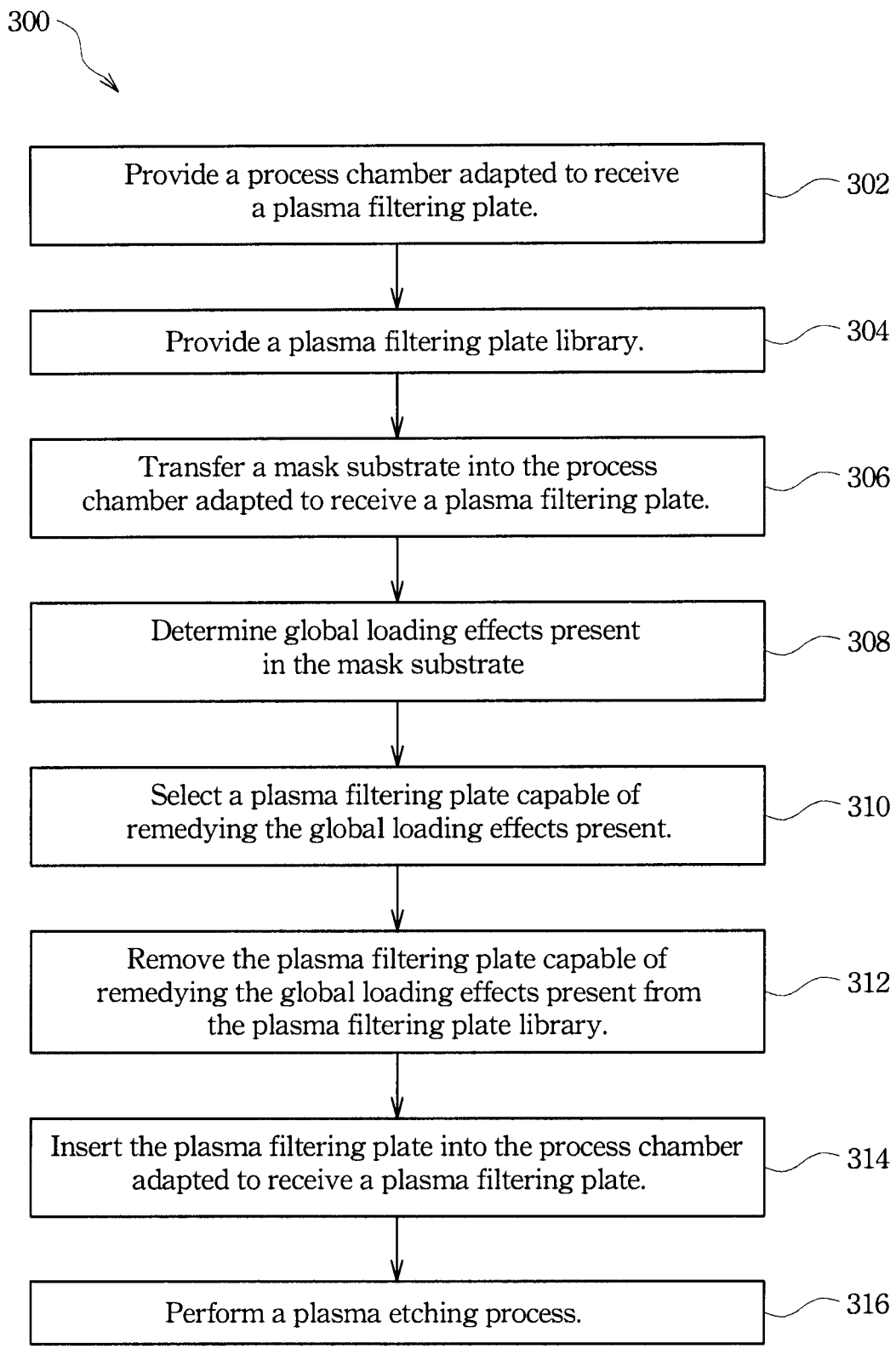
FIG. 7 is a flow chart of a method for plasma etching a substrate according to aspects of the present invention.

The system 100 may utilize the method 300 to etch a substrate (e.g., mask) with improved CDU. Referring to FIGS. 1 and 7, the method 300 begins with steps 302 and 304, which provide within the system 100 a process chamber 104 adapted to receive a plasma filtering plate 206 (e.g., FIG. 2) and a PFP library process chamber 200 including a PFP library 202 (see FIGS. 1, 5-6). In step 306, a mask substrate 120 is transferred from the mask loadlock 112 within the carrier chamber 102 into the process chamber 104 designated for plasma etching and adapted to receive a plasma filtering plate. Once mask substrate 120 is secured within process chamber 104, in step 308, the global loading effects present in the substrate (e.g., mask) are determined (i.e., the substrate and/or mask CDU profile is determined). In step 310, the global loading effects determination is used to select plasma filtering plate 206. The plasma filtering plate 206 is chosen based on the global loading effects determination. The selected plasma filtering plate will be patterned to improve the CDU profile of the specific substrate (e.g., mask) being fabricated and remedy the global loading effects arising from processes such as baking, exposing, developing, and/or etching. In step 312, the selected plasma filtering plate is removed from the PFP library 202 by the plate transfer arm 208 and transferred into the PFP loadlock chamber 212. Then, in step 314, the plasma filtering plate 206 is removed from the PFP loadlock chamber 212 by plasma filtering plate transfer arm 108, moved within the carrier chamber 102 to the process chamber 104 adapted to receive a plasma filtering plate, and inserted in the process chamber 104. Once the plasma filtering plate 206 is within the process chamber 104, the method 300 proceeds to step 316 where a plasma etching process is performed in the mask substrate 120.

Overall, the disclosed embodiments provide one or more of the following advantages: (1) a plasma filtering plate library is integrated into an etching system; (2) plasma filtering plates are automatically and easily changed to meet the needs of a particular substrate, mask, process chamber, etc.; (3) the process chamber itself is utilized as a support structure for the plasma filtering plate, which reduces particles generated from vibrations caused by processing; (4) plasma filtering plates comprising transparent material reduce the negative impact caused by the glow discharge during an etching process; and (5) unlike the prior art that only remedies effects arising from the etching process, the various patterned plasma filtering plates within the integrated plasma filtering plate library remedy global loading effects present from all substrate fabrication processes, such as baking, exposing, developing, and/or etching.

In summary, a method and system are provided for etching a substrate. Although the etching system 100 described above is utilized for etching mask substrates, the etching system 100 can not only be used for mask substrate 120 but also for semiconductor substrates. This method and system effectively remedy global loading effects present from the fabrication processes, such as baking, developing, exposure, and etching. Ultimately, this results in improved critical dimension uniformity profiles of substrates (e.g., masks).

In one embodiment, a system for etching a substrate comprises a plurality of process chambers; a plasma filtering plate library within at least one of the plurality of process chambers; at least one carrier chamber including a structure for transporting an etching item between ones of the plurality of process chambers; and a plurality of loadlock chambers operative to hold and load the etching item into the at least one carrier chamber.

In some embodiments, at least one of the plurality of process chambers are adapted to receive at least one plasma filtering plate. The at least one process chamber adapted to receive at least one plasma filtering plate may comprise an indentation in the sidewall of the process chamber configured to receive and support the plasma filtering plate within the process chamber.

In some embodiments, the plasma filtering plate library comprises a plurality of plasma filtering plates wherein one or more plasma filtering plates comprise a plurality of apertures. The plurality of apertures are patterned to remedy global loading effects present from at least two of the baking process, exposing process, developing process, and etching process.

In some embodiments, at least one plasma filtering plate may comprise a transparent material, such as quartz, glass, combinations thereof, or other suitable material. In some embodiments, the etching item may be a mask; and yet in alternate embodiments, the etching item may be a plasma filtering plate.

In one embodiment, a method for etching a substrate, in a system comprising a plurality of process chambers wherein at least one of the plurality of process chambers is adapted to receive at least one plasma filtering plate and a plasma filtering plate library within at least one of the plurality of process chambers, comprises selecting a plasma filtering plate from the plasma filtering plate library; removing the selected plasma filtering plate from the plasma filtering plate library; inserting the selected plasma filtering plate into one of the plurality of process chambers adapted to receive at least one plasma filtering plate; and performing a plasma etching process in the substrate. The method wherein the system further comprises at least one carrier chamber and a plurality of loadlock chambers, and the method further comprises transporting an etching item between ones of the plurality of process chambers and holding and loading the etching item into the at least one carrier chamber and within the plurality of loadlock chambers.

In some embodiments, the at least one of the plurality of process chambers adapted to receive at least one plasma filtering plate comprises an indentation in the sidewall of the process chamber configured to receive and support the plasma filtering plate within the process chamber.

In some embodiments, the plasma filtering plate library comprises a plurality of plasma filtering plates. The one or more of the plasma filtering plates comprise a plurality of apertures patterned to remedy global loading effects present in the substrate, which arise from at least two of the baking process, exposing process, developing process, and etching process.

In some embodiments, the at least one of the plurality of plasma filtering plates comprises one or more subplates. In yet other embodiments, the at least one of the plurality of plasma filtering plates comprises a transparent material.

In some embodiments, selecting the plasma filtering plate from the plasma filtering plate library comprises determining the global loading effects present in the substrate and choosing, based on the global loading effects determination, a plasma filtering plate capable of remedying the global loading effects present in the mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for etching a substrate in a system comprising a plurality of process chambers wherein one of the plurality of process chambers has sidewalls that include indentions to receive at least one plasma filtering plate and one of the plurality of process chambers includes a plasma filtering plate library, the method further comprising:
   selecting a plasma filtering plate from the plasma filtering plate library, wherein the plasma filtering plate library comprises a plurality of plasma filtering plates and wherein one or more of the plasma filtering plates comprise a plurality of apertures patterned to remedy critical dimension uniformity error present in the substrate;
   removing the selected plasma filtering plate from the plasma filtering plate library;
   inserting the selected plasma filtering plate into the indentions of the at least one of the plurality of process chambers adapted to receive at least one plasma filtering plate, such that the process chamber secures and supports the plasma filtering plate within the process chamber using the sidewalls of the process chamber; and
   performing a plasma etching process in the substrate.

2. The method of claim 1 wherein the system further comprises at least one carrier chamber and a plurality of loadlock chambers, the method further comprising:

transporting an etching item between ones of the plurality of process chambers; and holding and loading the etching item into the at least one carrier chamber and within the plurality of loadlock chambers.

3. The method of claim 1 wherein the critical dimension uniformity error present in the substrate arise from at least two of the baking process, exposing process, developing process, and etching process.

4. The method of claim 1 wherein at least one of the plurality of plasma filtering plates comprises one or more subplates.

5. The method of claim 1 wherein at least one of the plurality of plasma filtering plates comprises a transparent material.

6. The method of claim 1 wherein selecting the plasma filtering plate from the plasma filtering plate library comprises determining critical dimension uniformity error present in the substrate.

7. The method of claim 6 wherein selecting the plasma filtering plate from the plasma filtering plate library further comprises choosing, based on the critical dimension uniformity error determination, a plasma filtering plate capable of remedying the critical dimension uniformity error present in the substrate.

8. A method comprising:
selecting a plasma filtering plate from an automated and integrated plasma filtering plate library of an etching system;
removing the selected plasma filtering plate from the plasma filtering plate library;
selecting a process chamber from a group of process chambers adapted to receive plasma filtering plates;
providing the selected plasma filtering plate to the selected process chamber; and
etching a substrate in the selected chamber using the selected plasma filtering plate,
wherein selecting a plasma filtering plate comprises choosing, based on a critical dimension uniformity error determination, a plasma filtering plate capable of remedying the critical dimension uniformity error present in the substrate.

9. The method of claim 8 further comprising:
transporting the substrate between the plurality of process chambers.

10. The method of claim 9 further comprising:
holding and loading the substrate within one of a plurality of loadlock chambers.

11. The method of claim 8 wherein the selected plasma filtering plate comprises a plurality of apertures used to facilitate the step of etching.

12. The method of claim 8 wherein the selected plasma filtering plate comprises a plurality of subplates.

* * * * *